United States Patent [19]

Kasahara et al.

[11] Patent Number: 4,829,346
[45] Date of Patent: May 9, 1989

[54] FIELD-EFFECT TRANSISTOR AND THE SAME ASSOCIATED WITH AN OPTICAL SEMICONDUCTOR DEVICE

[75] Inventors: Kensuke Kasahara; Tomoji Terakado; Yasumasa Inomoto; Akira Suzuki; Tomohiro Itoh, all of Tokyo, Japan

[73] Assignee: NEC Corporation, Tokyo, Japan

[21] Appl. No.: 140,849

[22] Filed: Jan. 5, 1988

[30] Foreign Application Priority Data

Jan. 5, 1987 [JP] Japan .................. 62-678
Mar. 25, 1987 [JP] Japan ................ 62-72053

[51] Int. Cl.$^4$ .......................... H01L 29/80
[52] U.S. Cl. ..................... 357/22; 357/16; 357/4; 357/30; 357/19
[58] Field of Search ............... 357/16, 4, 30 E, 30 G, 357/30 P, 30 FO, 30 PF, 22 A, 22 MD, 41, 19

[56] References Cited

U.S. PATENT DOCUMENTS

| | | | |
|---|---|---|---|
| 4,017,332 | 4/1977 | James | 357/16 X |
| 4,593,304 | 6/1986 | Slayman et al. | 357/30 E |
| 4,670,767 | 6/1987 | Ohta | 357/16 X |
| 4,719,155 | 1/1988 | Matsumoto | 357/30 E X |
| 4,719,498 | 1/1988 | Wada et al. | 357/30 G |

FOREIGN PATENT DOCUMENTS

| | | | |
|---|---|---|---|
| 59-125657 | 7/1984 | Japan | 357/30 PF |
| 61-191063 | 8/1986 | Japan | 357/30 PF |

OTHER PUBLICATIONS

Shinohara, "Dislocation-Free GaAs Epitaxial Growth with the Use of Modulation-Doped AlAs-GaAs Superlattice Buffer Layers", Appl. Phys. Lett., 52(7), 15 Feb. 88, pp. 543-545.

Van Oirschoh, "CPE Growth of (AlGaAs) on GaP", Appl. Phys. Lett., vol. 24, No. 5, Mar. 1, 1974, pp. 272-273.

G. M. Metze et al., "Metal-Semiconductor Field-Effect. . . Epitaxy", Appl. Phys. Lett., 45(10, Nov. 15, 1984, pp. 1107-1109.

M. Razeghi, "Planar Monolithic Photoreceiver for 1.3-1.55 um . . . Heteroepitaxies", Appl. Phys. Lett., 49 (4), Jul. 28, 1986, pp. 215-217.

Primary Examiner—Andrew J. James
Assistant Examiner—William A. Mintel
Attorney, Agent, or Firm—Sughrue, Mion, Zinn, Macpeak and Seas

[57] ABSTRACT

A field-effect transistor comprises a semi-insulating InP substrate, a strained buffer layer of $Al_xGa_{1-x}As$ grown on the substrate, and an active layer of GaAs. The active layer is eased in regard to the influence of the lattice mismatching between the active layer and substrate. Such a field-effect transistor is associated with an optical device in a monolithic manner on a common semi-insulating InP substrate.

8 Claims, 4 Drawing Sheets

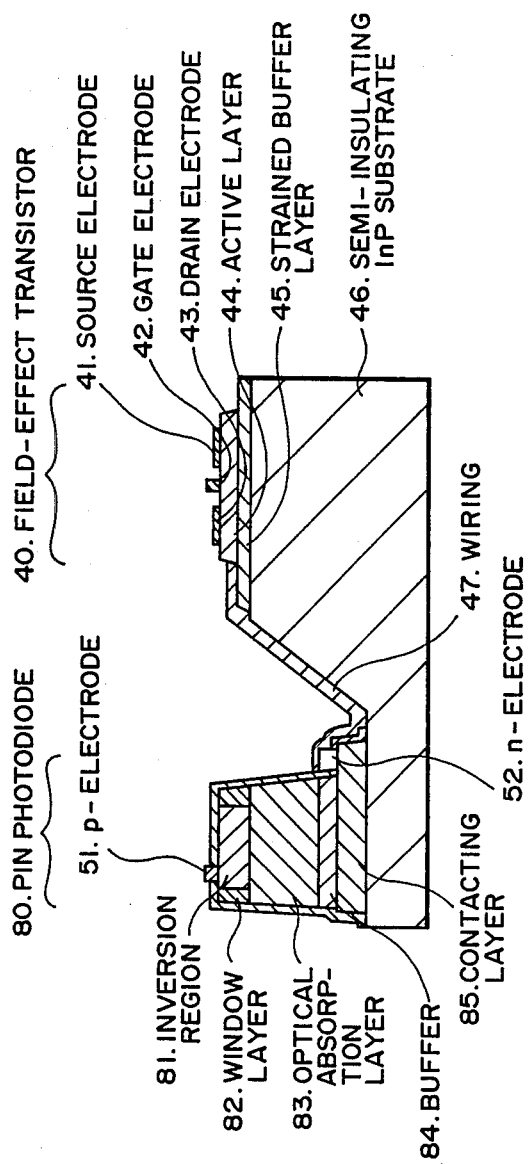

FIELD-EFFECT TRANSISTOR AND THE SAME ASSOCIATED WITH AN OPTICAL SEMICONDUCTOR DEVICE

FIELD OF THE INVENTION

The invention relates to a field-effect transistor and the same associated with an optical semiconductor device, and more particularly to a field-effect transistor and the same associated with an optical semiconductor device in which a field-effect transistor of a GaAs system is provided on an InP semiconductor substrate, and the field-effect transistor associated with an optical semiconductor device is provided on an InP semiconductor substrate.

BACKGROUND OF THE INVENTION

A conventional metal-semiconductor transistor utilizing GaAs (simply called "GaAsMESFET" hereinafter) is generally fabricated on a GaAs semiconductor substrate. Instead of such a GaAsMESFET, a GaAsMESFET fabricated on a Si semiconductor substrate has been proposed in the report entitled "Metal-semiconductor field-effect transistors fabricated in GaAs layers grown directly on Si substrates by molecular beam epitaxy" by G. M. Metze et al on pages 1107 to 1109 of "Applied Physics Letters 45(10), 15 November 1984." The GaAsMESFET comprises a semi-insulating Si substrate, an amorphous GaAs layer grown on the semi-insulating Si substrate, an undoped GaAs layer grown on the amorphous GaAs layer, an n-GaAs layer grown on the undoped GaAs layer, and gate, source and drain electrodes respectively provided on the n-GaAs layer. The GaAsMESFET is not described in detail herein because it is described in detail in the above mentioned report.

In addition, it is expected that an optoelectronics device will have expanded uses in an optical communication system, local area network (LAN), data link system and so on in accordance with the progress of optical communication technology. In order to adapt an optical device to a high performance optical system, the optical device is required to be of high performance, and so on. The optoelectronics device should have not only such advantages as a low fabrication cost, compact size, high reliability, non-adjustment quality and so on in accordance with the integration thereof, but also to be improved in regard to its response and sensitivity, thereby making it applicable to such a prospective optical communication system as an optical interconnection system, optical switching system and so on.

For this purpose, an optical device utilizing InP system material has been put into practical use in the field of optical communication for the reason that the optical device can be operated with high reliability, good matching property in a low loss and low dispersion wavelength band for an optical fiber and so on in accordance with the characteristics of the material.

In an electronics device utilizing such a InP system semiconductor material, it is difficult to obtain Schottky contact. A metal-insulator film semiconductor field-effect transistor (MISFET), junction gate field-effect transistor (JFET), and heterostructure junction bipolar transistor (HBT) have been researched and developed. A MISFET, on the other hand, is disadvantageous in that drift is high due to the surface state thereof. In the JFET and HBT the construction and fabricating process thereof are complicated, and the integration together with an optical device is difficult to be performed, although the operation thereof is stabilized.

On the contrary, an appropriate property of Schottky contacts can be obtained in the MESFET utilizing GaAs system semiconductor so that integrated circuits (IC's) will be shortly put into practical use in a class of large scale integrated circuits (LSI's) in accordance with the progress of FET integrating-process technology. In an optical device, on the other hand, disadvantages including decreased reliability in an optical device, and a limited transmitting property dependent on a transmitting loss and wavelength dispersion of an optical fiber result.

In order to compensate for the different disadvantages of InP and GaAs system materials, there is a study in which the optimum combination of InP system material for an optical device and GaAs system material for an electronics device is being sought for an optoelectronics integrated circuit utilizing a composite material of InP and GaAs systems. In this respect, an optoelectronics monolithic integrated device, in which a photoreceiver consisting of GaInAs to be associated with a MESFET consisting of GaAs provided on a semi-insulating GaAs substrate in accordance with the growth of GaInAs by a strained heteroepitaxy in a low pressure metalorganic chemical vapor deposition, has been proposed in the report entitled "Planar monolithic integrated photoreceiver for 1.3–1.55 μm wavelength applications using GaInAs-GaAs heteroepitaxies" by M. Razeghi on pages 215 to 217 of "Applied Physics Letters 49 (4), 28 July 1986".

According to the conventional GaAsMESFET as described before, however, there is a disadvantage that a field-effect transistor is formed with difficulty on the InP substrate due to the mismatching of lattices. For this reason, the GaAsMESFET is fabricated separately from such an optical device as a laser etc. which is formed on the InP substrate. Thereafter, the MESFET is connected through wirings to the optical device to form a driver for the optical device or an amplifier for a photoreceiver, however, with this arrangement, energy loss and noise are increased due to the presence of the wirings, and the whole configuration becomes enlarged due to the separate fabrications thereof. Additionally, an electronics device such as a logic circuit is not easily formed on the InP substrate.

According to the optoelectronics monolithic integrated device as described before, there are the further disadvantages that appropriate properties of an optical device are not obtained in an optical communication system, and reliability thereof is extremely decreased due to the dislocations caused by the mismatching of lattices because an optical device of a minority carrier device is formed on a semi-insulating GaAs substrate by a strained heteroepitaxy.

SUMMARY OF THE INVENTION

Accordingly, it is an object of the invention to provide a field-effect transistor which can be formed on a InP substrate.

It is a further object of the invention to provide a field-effect transistor which is easily fabricated and which has appropriate properties.

It is a still further object of the invention to provide a field-effect transistor associated with an optical semiconductor device in which high performance and reliability are obtained.

According to one aspect of the invention, a field-effect transistor includes a semi-insulating InP substrate on which is grown a strained buffer layer. An active layer of GaAs is grown on the strained buffer layer. A gate electrode for controlling the active layer and source and drain electrodes which are in ohmic contact with said active layer are formed. The active layer is thus eased in regard to the influence of the lattice mismatching between the active layer and the semi-insulating InP substrate by the presence of the strained buffer layer.

According to another aspect of the invention, a field-effect transistor associated with an optical semiconductor device includes a semi-insulating InP substrate on which is grown a field-effect transistor consisting of a GaAs system semiconductor including AlGaAs, and an optical device consisting of an InP system semiconductor including InGaAs or InGaAsP which are respectively provided in a monolithic state on said semi-insulating InP substrate. A strained buffer layer is positioned between the semi-insulating InP substrate and the field-effect transistor.

BRIEF DESCRIPTION OF THE DRAWINGS

The invention will be described in more detail in connection with following drawings wherein, FIG. 7 is a cross sectional view showing a field-effect transistor associated with an optical semiconductor device in a second embodiment according to the invention.

DESCRIPTION OF THE PREFERRED EMBODIMENTS

Figure 1:
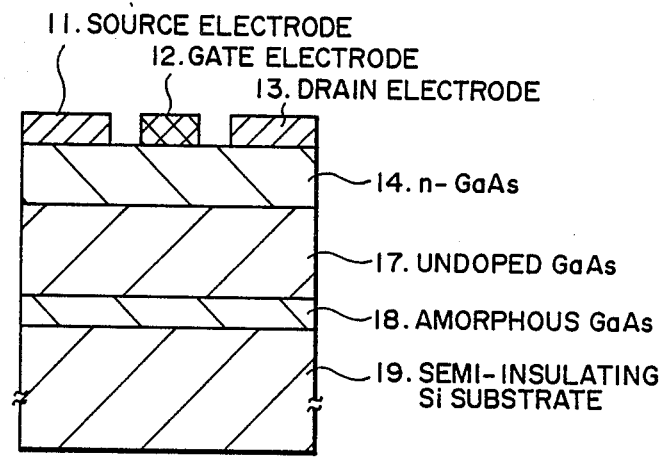
FIG. 1 is a cross sectional view showing a conventional field-effect transistor.

Before explaining an embodiment according to the invention, a conventional field-effect transistor as described before is explained in FIG. 1.

The conventional field-effect transistor comprises a semi-insulating Si substrate 19, an amorphous GaAs layer 18 grown on the Si substrate 19, an undoped GaAs layer 17 grown on the amorphous GaAs layer 18, an n-GaAs layer 14 grown on the undoped GaAs layer 17, and gate, source and drain electrodes 12, 11 and 13 respectively provided on the n-GaAs layer 14. As clearly shown in FIG. 1, a GaAs field-effect transistor is formed on a different semiconductor substrate of Si from GaAs. However, such a GaAs field-effect transistor is formed with difficulty on an InP substrate due to the mismatching of lattices as mentioned before.

Figure 2:
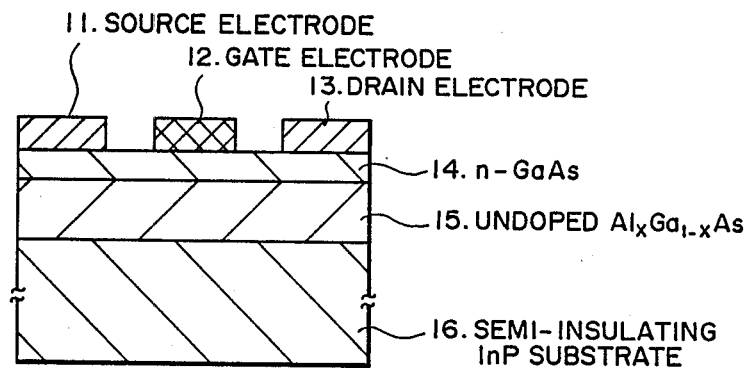
FIG. 2 is a cross sectional view showing a field-effect transistor in an embodiment according to the invention.

Next, a field-effect transistor in an embodiment according to the invention will be explained in FIG. 2. The field-effect transistor comprises a semi-insulating InP substrate 16, an undoped $Al_{0.4}Ga_{0.6}As$ layer 15 having a thickness of 1 $\mu$m grown on the InP substrate 16 by a molecular beam epitaxy, an n-GaAs layer 14 doped with Si having a thickness of 2000Å and carrier density of $2\times10^{17}cm^{-3}$ grown on the undoped $Al_{0.4}Ga_{0.6}As$ layer 15, and gate, source and drain electrodes 12, 11 and 13 respectively provided on the n-GaAs layer 14.

Figure 3:
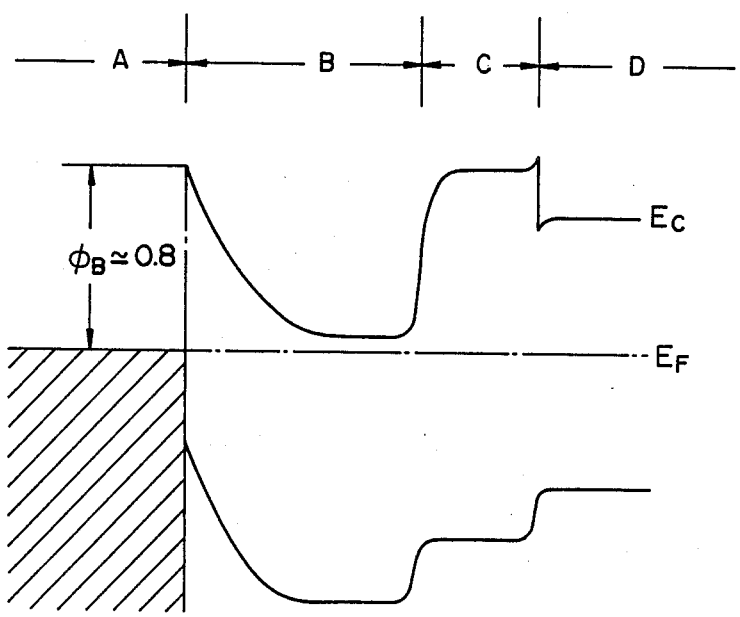
FIG. 3 is an explanatory diagram showing an energy band diagram in the embodiment.

In FIG. 3, there is shown an energy band diagram for the field-effect transistor in the embodiment wherein A is a gate metal region, B is an n-GaAs active layer region, C is an undoped $Al_xGa_{1-x}As$ layer region, and D is a semi-insulating InP substrate region. The field-effect transistor is based on the findings of the inventors that $Al_xGa_{1-x}As$ is grown in a good crystalline state on InP by an epitaxy, in spite of the fact that the mismatching of lattice as much as 3.7% exists between InP and $Al_xGa_{1-x}As$. In more detail, $Al_xGa_{1-x}As$ which is less in its electron affinity and larger in its bandgap than those of GaAs is positioned as a buffer layer having a predetermined thickness between the InP substrate 16 and n-GaAs layer 14 so that the influence of dislocation etc. caused by the mismatching of lattices is eased. For this reason, a high purity GaAs crystal is obtained on InP substrate. Furthermore, the interface between the $Al_xGa_{1-x}As$ buffer layer 15 and n-GaAs layer 14 is satisfactory and the gate electrode 12 and the source and drain electrodes 11 and 13 can be provided by a relatively easy method. Consequently, a good depletion mode GaAsMESFET is easily obtained. A GaAsMESFET thus obtained has the good properties of high frequency and high response, and can be associated with an optical device as described later so that it can be used as driver for the optical device, an amplifier for a photoreceiver, a logic circuit element and so on.

Figure 4:
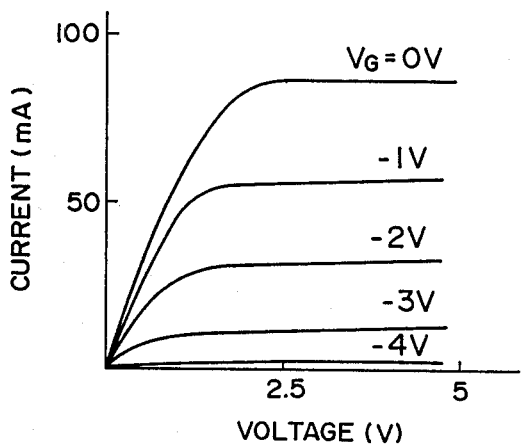
FIG. 4 is an explanatory diagram showing a drain and source current dependent on a gate voltage in the embodiment.

In FIG. 4, there is shown the property of a drain and source electrode current dependent on a gate voltage in the field-effect transistor in the embodiment wherein the width of the gate electrode 12 is approximately 280 $\mu$m. As clearly understood in FIG. 4, a good transistor property is obtained therein. This means that a GaAsMESFET fabricated on InP substrate can be operated with satisfactory properties.

The field-effect transistor in the embodiment may be modified by replacing the undoped $Al_{0.4}Ga_{0.6}As$ layer 15 an undoped GaAs layer having a thickness of 1 $\mu$m grown by a molecular beam epitaxy. Even in the modified field-effect transistor, it is confirmed that the same operation can be performed with good transistor properties as shown in FIG. 4. The undoped $Al_{0.4}Ga_{0.6}As$ layer 15 may be further replaced by AlAs. This means that the value X can be equal to or more than zero to equal to or less than 1 in regard to the buffer layer material of $Al_xGa_{1-x}As$ ($0\leq X\leq 1$). Still further, the buffer layer may be of a super-lattice layer of, for instance, AlInAs and AlGaAs, AlInAs and GaAs, and so on. Otherwise, a field-effect transistor utilizing a heterostructure junction may be fabricated on a semi-insulating InP substrate in such a form as a selective doped two-dimensional electron gas FET, high electron mobility doped channel MISFET, and semiconductor insulator semiconductor FET.

Figure 5:
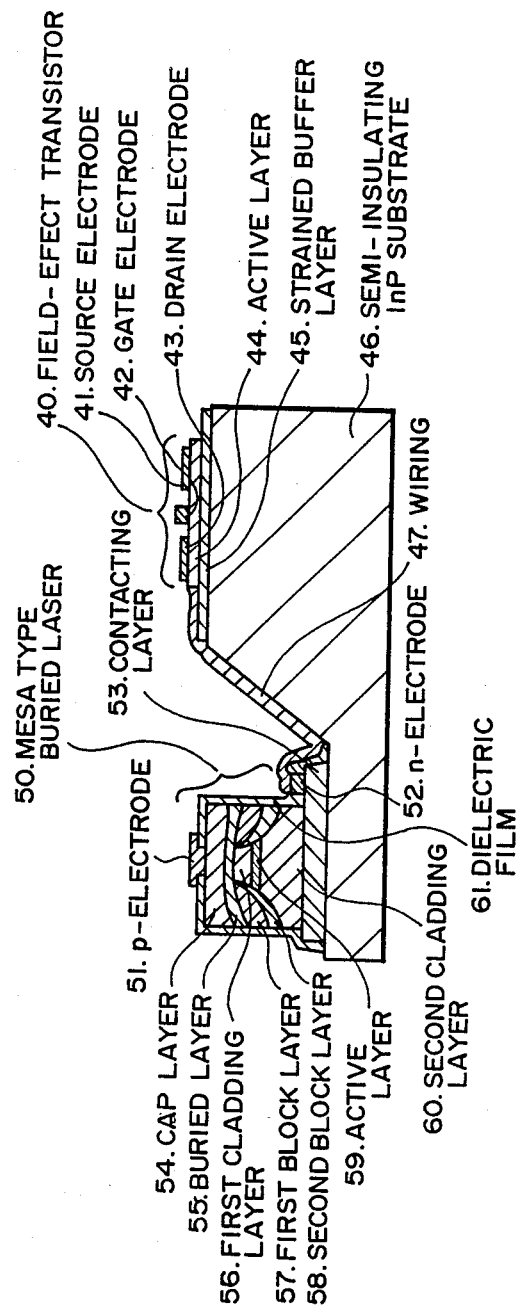
FIG. 5 is a cross sectional view showing a field-effect transistor associated with an optical semiconductor device in a first embodiment according to the invention.

In FIG. 5, there is shown a field-effect transistor associated with an optical semiconductor device in a first embodiment according to the invention which comprises a semi-insulating InP substrate 46, a laser contacting layer 53 of n-$In_{0.87}Ga_{0.13}As_{0.29}P_{0.71}$ having a thickness of 1 $\mu$m and carrier density of $1\times10^{18}cm^{-3}$ grown on the InP substrate 46, a mesa type buried laser 50 having an oscillation wavelength of 1.3 μm provided on the laser contacting layer 53, a strained buffer layer 45 of an undoped GaAs having a thickness of 0.5 μm grown on the InP substrate 46, an active layer 44 of n-GaAs having a thickness of 0.2 μm and carrier density of $1\times10^{17}cm^{-3}$ grown on the standard buffer layer 45, a gate electrode 42 of Al having a thickness of 0.3 μm and length of 1 μm, and source and drain electrodes 41 and 43 each of AuGeNi. The mesa type buried laser 50 includes a p-electrode 51 of AuZn, and n-electrode 52 of AuGeNi, a cap layer 54, a buried layer 55, first and second cladding layers 56 and 60, first and second block layers 57 and 58, an active layer 59, and a dielectric film 61. As clearly shown in FIG. 5, a field-effect transistor 40 and the mesa type buried laser 50 are provided on a common InP substrate 46 to be connected to each other by wirings 47 of Ti/Au formed therebetween.

Figure 6A:
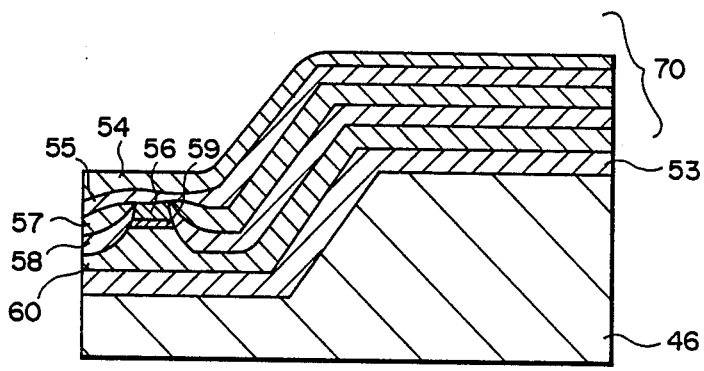
FIGS. 6A to 6C are cross sectional views showing a process for fabricating a field-effect transistor associated with an optical semiconductor device in the first embodiment.
Figure 6B:
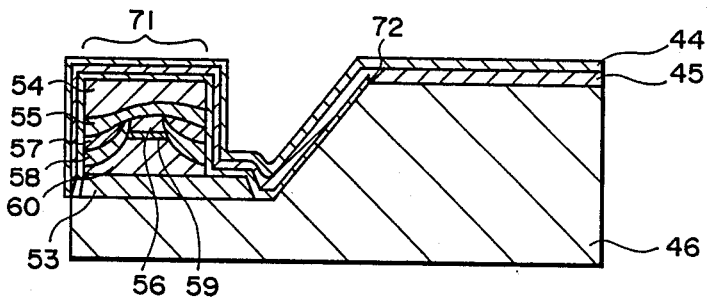
Figure 6C:
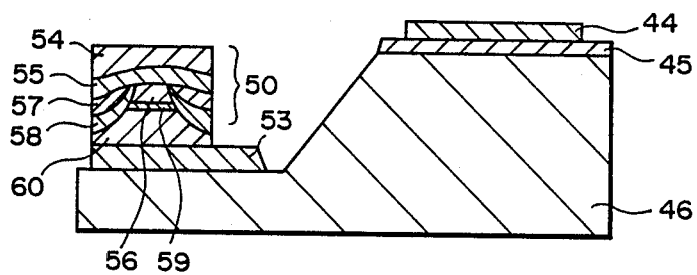

In fabricating the field-effect transistor 40 associated with the mesa type buried laser 50 in the first embodiment, the laser contacting layer 53 and several layers indicated by 70 for the buried laser 50 are firstly grown on the semi-insulating InP substrate 46 having a step-like configuration of approximately 5 μm by a liquid or vapor phase epitaxy as shown in FIG. 6A. Secondly, the layers 70 are shaped to be of a mesa-stripe, and the laser contacting layer 53 is subject to a mesa-etching such that the InP substrate 46 is exposed on its upper surface. Sequentially, a mask 72 of SiO₂ is formed on a laser mesa portion 71, and the strained buffer layer 45 and active layer 44 are grown by a molecular beam epitaxy as shown in FIG. 6B. Thirdly, portions of the strained buffer layer 45 and active layer 44 are removed on the mask 72, and the active layer 44 is then formed with a predetermined pattern as shown in FIG. 6C. Finally, the electrodes 41 to 43, 51 and 52, and wirings 47 are formed with predetermined patterns to provide an optoelectronics integrated circuit as shown in FIG. 5.

In FIG. 7, there is shown a field-effect transistor associated with an optical semiconductor device in a second embodiment according to the invention which comprises a field-effect transistor 40 and a PIN photodiode 80. The field-effect transistor 40 is provided on a strained buffer layer 45 of an undoped GaAs having a thickness of 0.5 μm which is grown on a semi-insulating InP substrate 46, and includes an active layer 44 of n-GaAs having a thickness of 0.2 μm and carrier density of $1\times10^{17}cm^{-3}$, a gate electrode 42 of Al having a thickness of 0.3 μm and length of 1 μm, and source and drain electrodes 41 and 43, while the PIN photodiode 80 is provided on a photodiode contacting layer 85 of n-In$_{0.87}$Ga$_{0.13}$As$_{0.29}$P$_{0.71}$ having a thickness of 1 μm and carrier density of $1\times10^{18}cm^{-3}$ which is grown on the InP substrate 46, and includes p and n-electrodes 51 and 52, an inversion region 81, a window layer 82, an optical absorption layer 83 of In$_{0.47}$Ga$_{0.53}$As having a bandgap energy wavelength of 1.67 μm and a buffer layer 84. The field-effect transistor 40 and PIN photodiode 80 are connected to each other on a common substrate of the semi-insulating InP substrate 46 by wirings 47.

In fabricating the field-effect transistor 40 associated with the PIN photodiode 80 in the second embodiment, there are firstly grown the photodiode contacting layer 85 of In$_{0.87}$Ga$_{0.13}$As$_{0.29}$P$_{0.71}$ having a thickness of 1.0 μm and carrier density of $1\times10^{18}cm^{-3}$, the photodiode buffer layer 84 of n-InP having a thickness of 0.5 μm and carrier density of $2\times10^{15}cm^{-3}$, the optical absorption layer 83 of n-In$_{0.47}$Ga$_{0.53}$As having a thickness of 1.0 μm and carrier density of $2\times10^{15}cm^{-3}$, and the window layer 82 of n-InP having a thickness of 1.0 μm and carrier density of $2\times10^{15}cm^{-3}$ on the semi-insulating InP substrate 46 sequentially. Secondly, the photodiode contacting layer 85, photodiode buffer layer 84, optical absorption layer 83, and window layer 82 are subject to the mesa-etching except a portion of the PIN photodiode 80 such that the semi-insulating InP substrate 46 is exposed on its upper surface for the field-effect transistor 40. Then, a mask of SiO₂ is formed on the portion of the PIN photodiode 80, and the strained buffer layer 45 of an undoped GaAs having a thickness of 0.5 μm and active layer 44 of n-GaAs having a thickness of 0.2 μm and carrier density of $1\times10^{17}cm^{-3}$ on the exposed semi-insulating InP substrate 46. Next, the strained buffer layer 45 and active layer 44 are removed on the portion of the PIN photodiode 80, and the active layer 44 is formed with a predetermined pattern by a mesa-etching method. Thereafter, a diffusion of Zn is selectively performed to form the p-inversion region 81 by use of a mask of SiO₂. Finally, the gate electrode 42, source and drain electrodes 41 and 43, p and n-electrodes 51 and 52, and wirings 47 are formed with predetermined patterns to provide an optoelectronics integrated circuit in the second embodiment.

As clearly understood from the embodiments, an optical device of InP system semiconductor including InGaAs or InGaAsP which is matched in regard to its lattices is provided on a semi-insulating InP substrate so that the optical device has high performance and high reliability.

Further, a field-effect transistor consisting of GaAs system semiconductor including AlGaAs is positioned on a strained buffer layer consisting of GaAs or AlGaAs grown on a semi-insulating InP substrate so that an electronics device which is not affected by the mismatching of lattices between the substrate and a channel layer is obtained having sufficient performance and high reliability. Consequently, an optimum combination of InP system material for an optical device and GaAs system material for an electronics device is obtained to provide an optoelectronics device having high performance and high reliability.

In the embodiments as described above, the following modifications can be made. Firstly, a gate electrode of a field-effect transistor may be of other materials by which Schottky junction can be obtained in place of Al. Secondly, thickness, carrier density, and composition of an active layer may be changed dependent on a required property of an optoelectronics device. Thirdly, construction may be changed by use of a structure utilizing two-dimensional electron gas of a heterostructure including AlGaAs mixed crystal. Fourthly, an optical device may be one of a mesa type buried laser, PIN photodiode, light emitting diode, avalanche photodiode, optical bistable element, optical amplifier, optical functionable element including an optical switching means, and so on. Fifthly, an electronics device may be one of a field-effect transistor, diode, resistor, and so on. Finally, a scale of an integrated circuit is not limited to a specified dimension.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A field-effect transistor comprising,
a semi-insulating InP substrate,
a strained buffer layer grown on said semi-insulating InP substrate,
an active layer of GaAs grown on said strained buffer layer,
a gate electrode for controlling said active layer, and
source and drain electrodes which are in ohmic contact with said active layer,
wherein the presence of said strained buffer layer reduces the influence of the lattice mismatching between said active layer and said semi-insulating InP substrate.

2. A field-effect transistor according to claim 1, wherein said GaAs of said active layer is n-type, and said strained buffer layer is of $Al_xGa_{1-x}As$ where X is zero to one.

3. A field-effect transistor according to claim 1, wherein said strained buffer layer is of GaAs.

4. A field-effect transistor according to claim 1, wherein said strained buffer layer is of AlAs.

5. A field-effect transistor according to claim 1, wherein said strained buffer layer is of a super-lattice layer.

6. A field-effect transistor associated with an optical device comprising,
a semi-insulating InP substrate,
a field-effect transistor consisting of GaAs system semiconductor including AlGaAs, and an optical device consisting of InP system semiconductor including InGaAs and InGaAsP which are respectively provided in a monolithic state on said semi-insulating InP substrate, and
a strained buffer layer which is positioned between said semi-insulating InP substrate and said field-effect transistor.

7. A field-effect transistor associated with an optical device according to claim 6,
wherein said strained buffer layer is of $Al_xGa_{1-x}As$, where X is zero to one, and
said field-effect transistor includes an active layer of GaAs grown on said strained buffer layer, a gate electrode for controlling said active layer, and source and drain electrodes which are in ohmic contact with said active layer.

8. A field-effect transistor associated with an optical device according to claim 6,
wherein said strained buffer layer is of a GaAs layer, and
said field-effect transistor includes an active layer of GaAs grown on said strained buffer layer, a gate electrode for controlling said active layer, and a source and drain electrodes which are in ohmic contact with said active layer.

* * * * *